(12) United States Patent
Miyashita

(10) Patent No.: US 8,110,874 B2
(45) Date of Patent: Feb. 7, 2012

(54) HYBRID SUBSTRATES AND METHOD OF MANUFACTURE

(75) Inventor: Katsura Miyashita, Kanagawa (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 193 days.

(21) Appl. No.: 12/400,548

(22) Filed: Mar. 9, 2009

(65) Prior Publication Data

US 2009/0230432 A1   Sep. 17, 2009

Related U.S. Application Data

(60) Provisional application No. 61/036,933, filed on Mar. 15, 2008.

(51) Int. Cl.
*H01L 27/12* (2006.01)

(52) U.S. Cl. .................. 257/351; 257/350; 257/369

(58) Field of Classification Search .................. 257/350, 257/351, 369
See application file for complete search history.

(56) References Cited

U.S. PATENT DOCUMENTS

| | | | |
|---|---|---|---|
| 6,242,293 B1 * | 6/2001 | Danzilio | 438/172 |
| 7,399,686 B2 * | 7/2008 | Chen et al. | 438/478 |
| 2007/0054465 A1 * | 3/2007 | Currie et al. | 438/455 |
| 2007/0246702 A1 * | 10/2007 | Andrieu et al. | 257/18 |

* cited by examiner

*Primary Examiner* — Zandra Smith
*Assistant Examiner* — Christy Novacek
(74) *Attorney, Agent, or Firm* — Banner & Witcoff, Ltd.

(57) ABSTRACT

A hybrid substrate circuit on a common substrate is disclosed. A first circuit formed in a first semiconductor material is isolated via a buried oxide layer from a second circuit formed in a second semiconductor material. The first and second circuits may include CMOS, HEMTs, P-HEMTs, HBTs, radio frequency circuits, MESFETs, and various pFETs and nFETs.

10 Claims, 8 Drawing Sheets

HYBRID SUBSTRATES AND METHOD OF MANUFACTURE

RELATED APPLICATION

This application claims priority to U.S. Provisional Application Ser. No. 61/036,933, filed Mar. 15, 2008, whose contents are expressly incorporated herein by reference.

TECHNICAL FIELD

Aspects of the invention relate to hybrid substrates for semiconductors.

BACKGROUND

Large scale integrated circuits and multiple layer integrated circuits are utilized, for example, in the telecommunications industry, for example, in optical fiber amplification systems, wireless communications systems (including satellite) and optical laser and light emitting diode systems. While CMOS LSIs on silicon substrates are generally known, CMOS LSIs on silicon substrates are not preferred in the above applications. III-V Integrated circuits are preferred in the above industries due to the greater channel mobility of the compounds gallium arsenide (GaAs) or indium phosphide (InP) than silicon. Also, the breakdown voltage of GaAs and InP is higher than the breakdown voltage of silicon. The higher breakdown voltage of GaAs and InP is generally beneficial for analog LSIs (large scale integrated circuits) and, accordingly, GaAs and InP-based devices are used for analog LSIs. Because of these reasons, the III-V integrated circuits are preferred in these industries. For example, heterojunction bipolar transistors (HBTs) are used in the cellular industry for power amplification. N-type and P-type field effect transistors (FETs) are used almost universally with other circuits or together. High electron mobility transistors (HEMTs) are used in communications applications such as satellite receivers. Examples of potential applications of these different types of integrated circuits are limited only by the imagination.

Consequently, it is known in the art of telecommunications to use III-V integrated circuits on III-V substrates. These integrated circuits are generally used with at least some silicon-based CMOS circuitry. Because of the different substrates, the III-V integrated circuits and the silicon CMOS circuits have been provided on separate integrated circuits. The separate integrated circuits have to be connected via a circuit board or other connecting structure. This prevents miniaturization and further integration of these circuits. As such, miniaturization of systems would be beneficial in environments where small and lightweight devices are preferred.

SUMMARY

Aspects of the invention pertain to providing a hybrid substrate technology to allow circuits requiring different substrates to be combined in a single integrated circuit.

As a result, various embodiments of devices with hybrid substrates are described in the following detailed description of the invention and drawings. In one or more aspects, buried oxide layers are used to isolate a substrate from another semiconductor layer of a different type. Circuits may then be formed on the original substrate, layers deposited on the substrate, or layers deposited over the buried oxide layer.

DETAILED DESCRIPTION

One or more aspects of the invention relate to forming devices requiring different substrates on a single chip.

It is noted that various connections are set forth between elements in the following description. It is noted that these connections in general and, unless specified otherwise, may be direct or indirect and that this specification is not intended to be limiting in this respect.

In accordance with one or more aspects, a buried oxide layer is provided on or in a substrate. A different type of semiconducting material may then be deposited or grown on the buried oxide layer. The device may then be formed on different type of semiconducting material.

For purposes herein, the figures are described at times as containing circuits. It is appreciated that the individual transistors or elements described in each figure are considered to represent from one to a number of transistors relevant to forming a desired circuit or circuits. For instance, in FIG. 4, the radio frequency transistor may represent a number of radio frequency transistors that then form a radio frequency circuit.

First Embodiment

Figure 1:
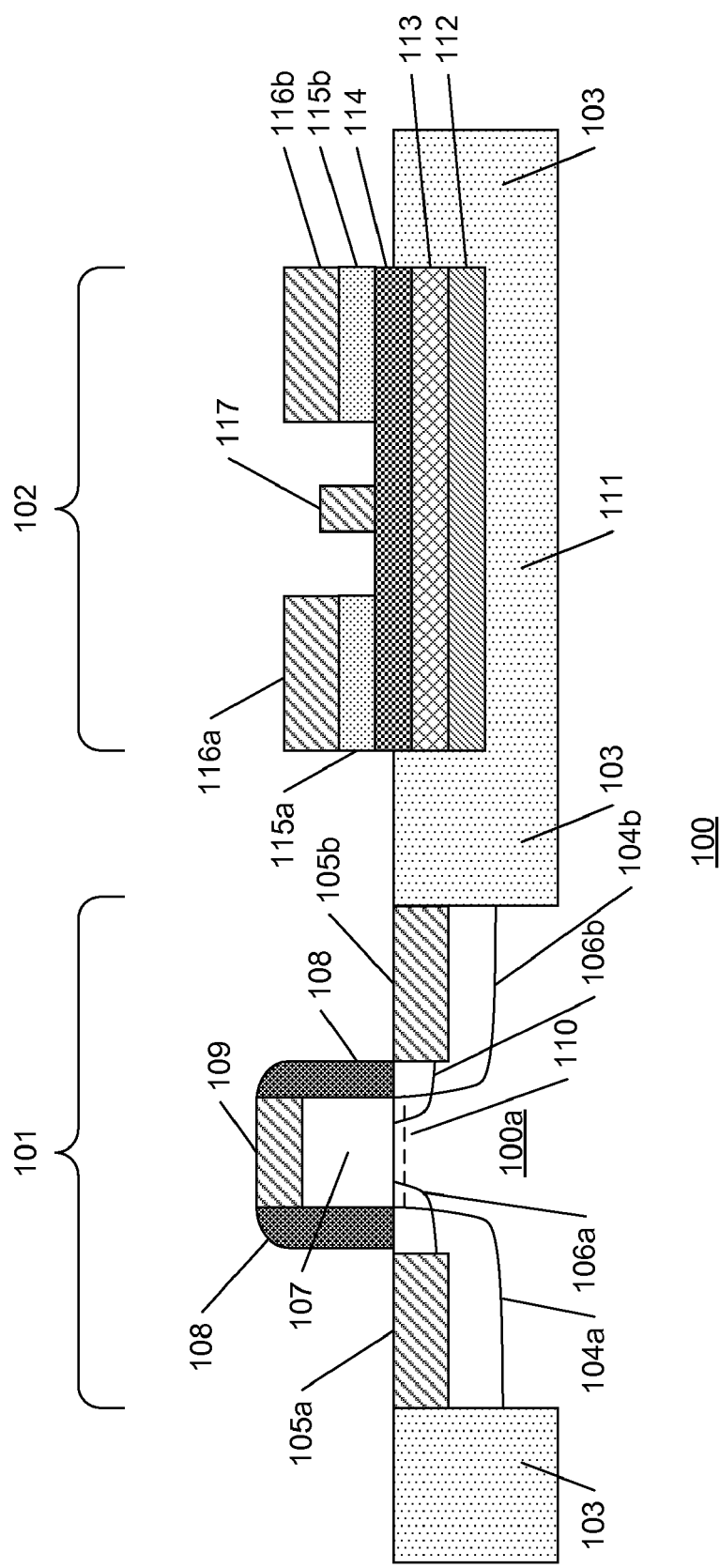
FIG. 1 shows a first illustrative embodiment of a hybrid substrate technology circuit including a silicon-based CMOS device and an indium phosphide high electron mobility transistor (HEMT).

FIG. 1 shows a first illustrative embodiment of a hybrid substrate technology circuit including a silicon-based CMOS device and an indium phosphide high electron mobility transistor (HEMT).

FIG. 1 shows a CMOS device 101 and an indium phosphide high electron mobility transistor (HEMT) 102 constructed above substrate 100. For purposes of simplicity, CMOS device 101 is represented by a MOSFET in FIG. 1 (and other Figures). The complementary MOSFET (for CMOS device 101) is not shown as it has a similar structure to the MOSFET shown for CMOS device 101. As known in the art, epitaxial layer 100*a* may be modified (p-type or n-type) (for instance, formed in a well) in accordance with the type of MOSFET complementary to the MOSFET shown in FIG. 1 (and other Figures with CMOS devices).

An epitaxial growth layer of silicon 100a may be grown on substrate 100. CMOS device 101 may be formed in the epitaxial layer 100a based on conventional processing techniques. FIG. 1 also shows shallow trench isolation regions 103 separating the CMOS device 101 from other devices (including but not limited to other devices and indium phosphide devices). CMOS device 101 may be a conventional CMOS device including a source deep implantation region 104a and a drain deep implantation region 104b. Shallower implantation regions are shown in FIG. 1 as a source shallow implantation region 106a and drain shallow implantation region 106b. CMOS device 101 includes source contact region 105a and drain contact region 105b. CMOS device 101 includes gate 107 with gate contact 109 bounded by sidewalls 108. As is known in the art, a gate oxide exists between gate 107 (not shown) and epitaxial layer 100a. During operation channel 110 is formed under the gate oxide and permits operation of the device. The various processing techniques to form CMOS device 101 are known in the art and not addressed in detail here.

The indium phosphate HEMT device 102 is formed between shallow trench isolation regions 103 and on top of buried oxide layer 111. Indium phosphate HEMT device 102 is a standard indium phosphate HEMT device formed based on conventional manufacturing techniques. Indium phosphate HEMT device 102 includes an indium phosphate (InP) substrate 112. An indium gallium arsenide (InGaAs) channel layer 113 is formed on top of the indium phosphate (InP) substrate 112. Next, an indium aluminum arsenide (InAlAs) barrier layer 114 is formed on top of the indium gallium arsenide (InGaAs) channel layer 113. Next, source region 115 and drain region 115b are formed on the indium aluminum arsenide (InAlAs) layer 114. Source contact 116a and drain contact 116b and gate contact 117 are formed on their respective regions.

As described above, HEMT devices are useful in military and commercial applications where low noise figures and high gain, particularly at millimeter-wave frequencies, are required. Through the use of a hybrid substrate technology as shown in FIG. 1, indium phosphide HEMT devices may be placed alongside silicone-based CMOS devices on a common substrate. Accordingly, overall size, interconnect complexity (between chips), and interconnect noise and delay may be reduced by placing indium phosphide HEMT devices next to their CMOS control logic.

Second Embodiment

Figure 2:
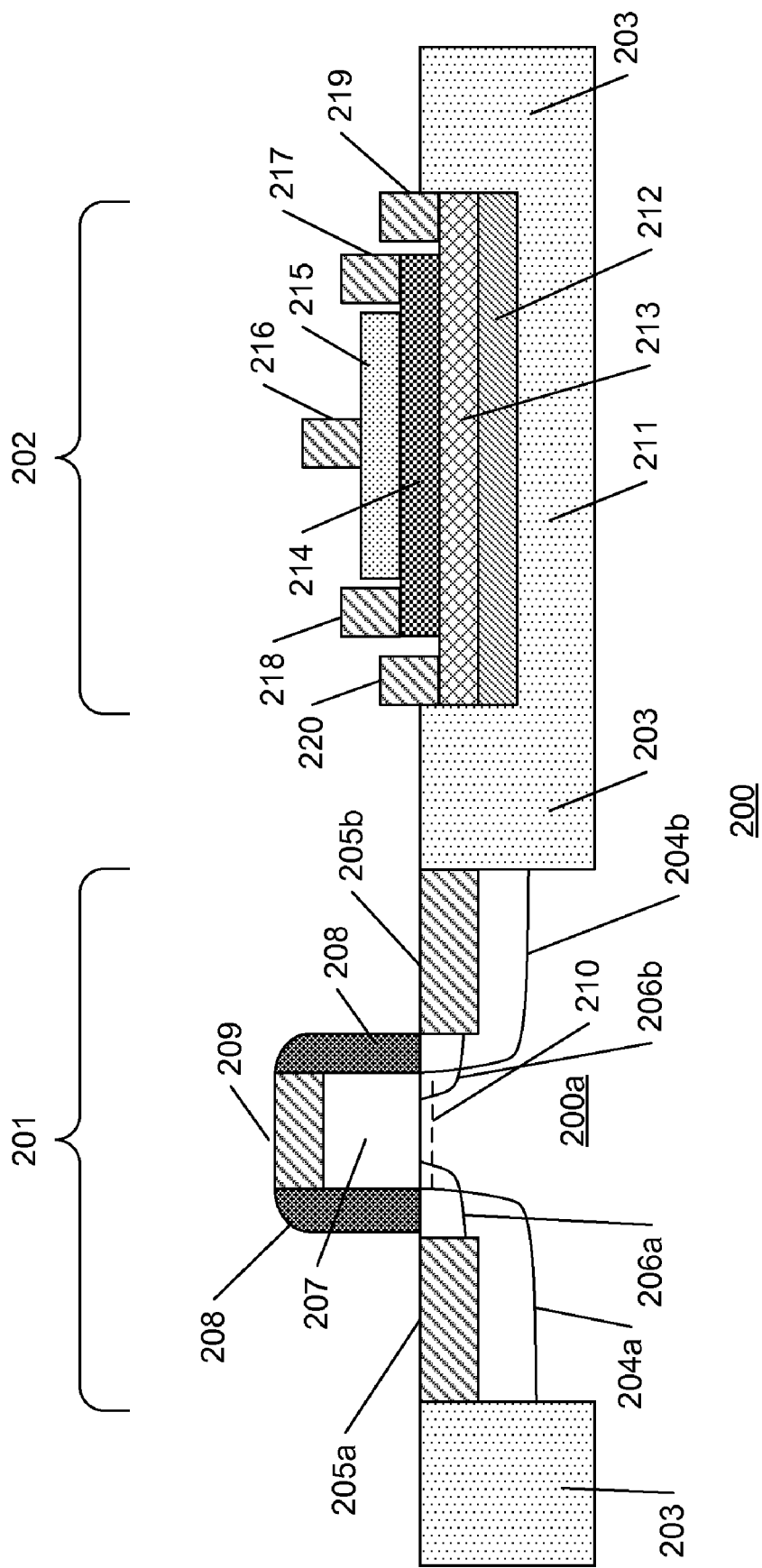
FIG. 2 shows a second illustrative embodiment of a hybrid substrate technology circuit including a silicon-based CMOS device and an indium phosphide heterojunction bipolar transistor (HBT).

FIG. 2 shows a second illustrative embodiment of a hybrid substrate technology circuit including a silicon-based CMOS device and an indium phosphide heterojunction bipolar transistor (HBT).

FIG. 2 shows a second embodiment in which a CMOS device and an indium phosphide heterojunction bipolar transistor (HBT) are formed on a common substrate. An epitaxial growth layer of silicon 200a may be grown on substrate 200. CMOS device 201 may be formed in the epitaxial layer 200a based on conventional processing techniques. FIG. 2 also shows shallow trench isolation regions 203 separating the CMOS device 201 from other devices (including but not limited to other devices and indium phosphide devices). CMOS device 201 may be a conventional CMOS device including a source deep implantation region 204a and a drain deep implantation region 204b. Shallower implantation regions are shown in FIG. 2 as a source shallow implantation region 206a and drain shallow implantation region 206b. CMOS device 201 includes source contact region 205a and drain contact region 205b. CMOS device 201 includes gate 207 with gate contact 209 bounded by sidewalls 208. As is known in the art, a gate oxide exists between gate 207 (not shown) and epitaxial layer 200a. During operation channel 210 is formed under the gate oxide and permits operation of the device. The various processing techniques to form CMOS device 201 are known in the art and not addressed in detail here.

The indium phosphate an indium phosphide heterojunction bipolar transistor (HBT) device 202 is formed between shallow trench isolation regions 203 and on top of buried oxide layer 211. Indium phosphate heterojunction bipolar transistor device 202 is a standard indium phosphate heterojunction bipolar transistor formed based on conventional manufacturing techniques. Indium phosphate heterojunction bipolar transistor device 202 includes an indium phosphate (InP) substrate 212 formed on buried oxide layer 211. An indium gallium arsenide (InGaAs) collector layer 213 is formed on top of the indium phosphate (InP) substrate 212. Next, an indium gallium arsenide (InGaAs) base layer 214 is formed on top of the indium gallium arsenide (InGaAs) collector layer 213. Next, an indium phosphide (InP) emitter layer 215 is formed on the indium gallium arsenide base 214. Finally, collector contacts 219 and 220, base contacts 217 and 218, and emitter contact 216 are formed on the collector 213, base 214, and emitter 215, respectively.

Through the use of a hybrid substrate technology as shown in FIG. 2, indium phosphide HBT devices may be placed alongside silicone-based CMOS devices on a common substrate. Accordingly, overall size, interconnect complexity (between chips), and interconnect noise and delay may be reduced by placing indium phosphide HBT devices next to their CMOS control logic.

Third Embodiment

Figure 3:
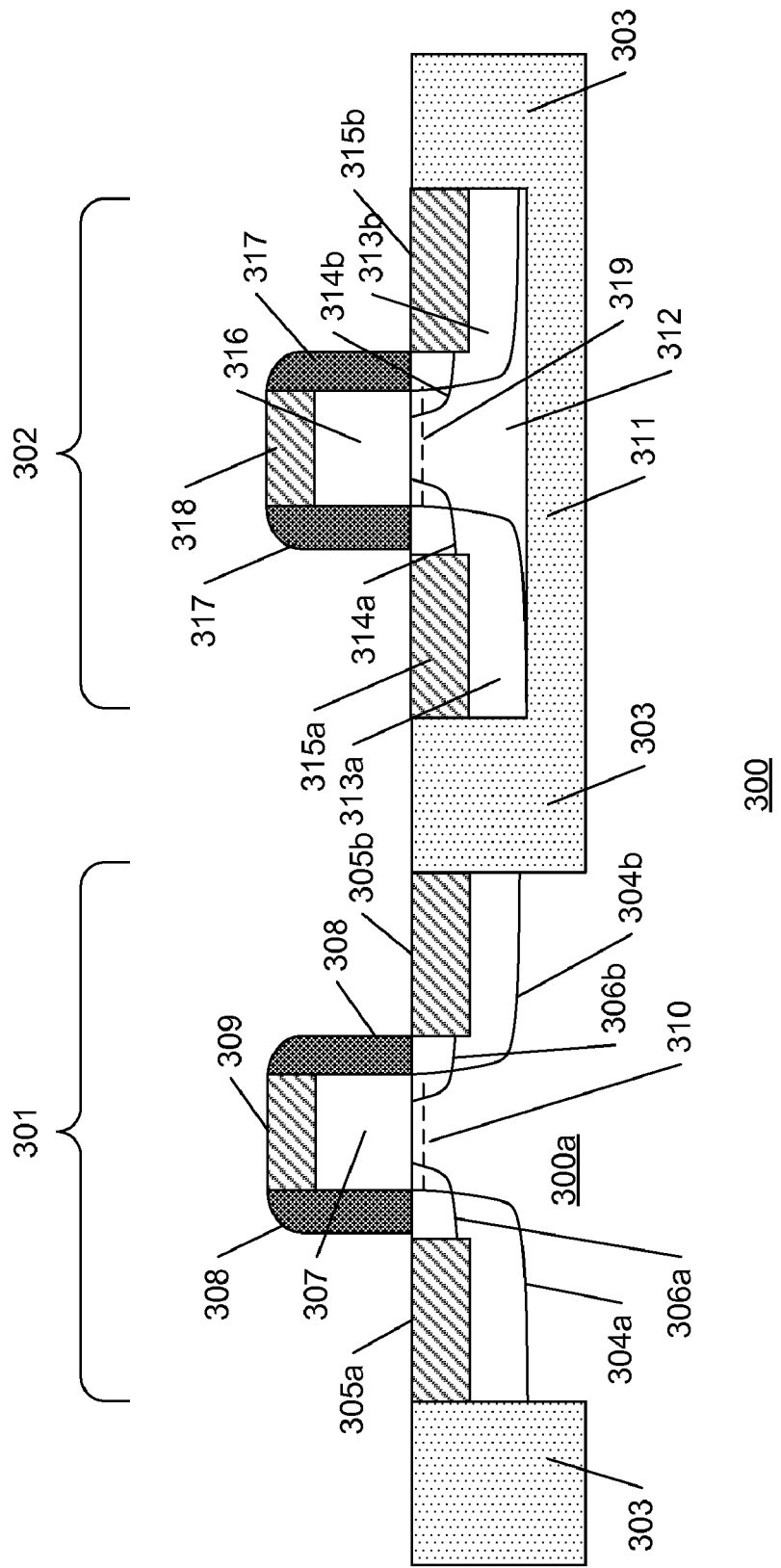
FIG. 3 shows a third illustrative embodiment of a hybrid substrate technology circuit including a silicon-based pFET device and a gallium arsenide nFET device.

FIG. 3 shows a third illustrative embodiment of a hybrid substrate technology circuit including a silicon-based pFET device and a gallium arsenide nFET device.

FIG. 3 shows nFETs and pFETs formed with gallium arsenide GaAs and silicon substrates, respectively. FIG. 3 represents the pFETs by pFET 301 formed on epitaxial layer 300a that is formed on substrate 300. As described above, an epitaxial growth layer of silicon 300a may be grown on substrate 300. pFET device 301 may be formed in the epitaxial layer 300a based on conventional processing techniques. FIG. 3 also shows shallow trench isolation regions 303 separating the pFET device 301 from other devices (including but not limited to other pFET devices and nFET devices). pFET device 301 may be a conventional pFET device including a source deep implantation region 304a and a drain deep implantation region 304b. Shallower implantation regions are shown in FIG. 3 as a source shallow implantation region 306a and drain shallow implantation region 306b. pFET device 301 includes source contact region 305a and drain contact region 305b. pFET device 301 includes gate 307 with gate contact 309 bounded by sidewalls 308. As is known in the art a gate oxide exists between gate 307 (not shown) and epitaxial layer 300a. During operation channel 310 is formed under the gate oxide and permits operation of the device. The various processing techniques to form pFET device 301 are known in the art and not addressed in detail here.

nFET device 302 may be formed on the buried oxide layer 311. First, a gallium arsenide GaAs layer 312 is deposited or grown (for instance, by epitaxial growth as is known in the art) on the buried oxide layer 311. nFET device 302 includes a source deep implantation region 313a and a drain deep implantation region 313b. Shallower implantation regions are shown in FIG. 3 as a source shallow implantation region 314a and drain shallow implantation region 314b. nFET device 302 includes source contact region 315a and drain contact region 315b. nFET device 302 includes gate 316 with gate contact 318 bounded by sidewalls 317. As is known in the art, a gate oxide exists between gate 316 (not shown) and gallium arsenide layer 312. During operation, channel 319 is formed under the gate oxide and permits operation of the device. The various processing techniques to form nFET device 302 are known in the art and not addressed in detail here.

Through the use of a hybrid substrate technology as shown in FIG. 3, a gallium arsenide GaAs nFET may be placed alongside silicon-based pFET on a common substrate. As is known, although following the same design rule, silicon nFETs and silicon pFETs may operate differently based on differences in carrier mobility and other differences. This difference in operation between nFETs and pFETs when having the same semiconductor body can also apply to other semiconductor types. By matching carrier mobility and other aspects of semiconductor FETs based on body type, the differences between nFETs and pFETs can be minimized. Accordingly, the same design rule may be used for both the pFET 301 and the nFET 302 by selecting the different body types of the transistors such that the differences in mobility and other factors between the nFET and pFET are equalized.

Fourth Embodiment

Figure 4:
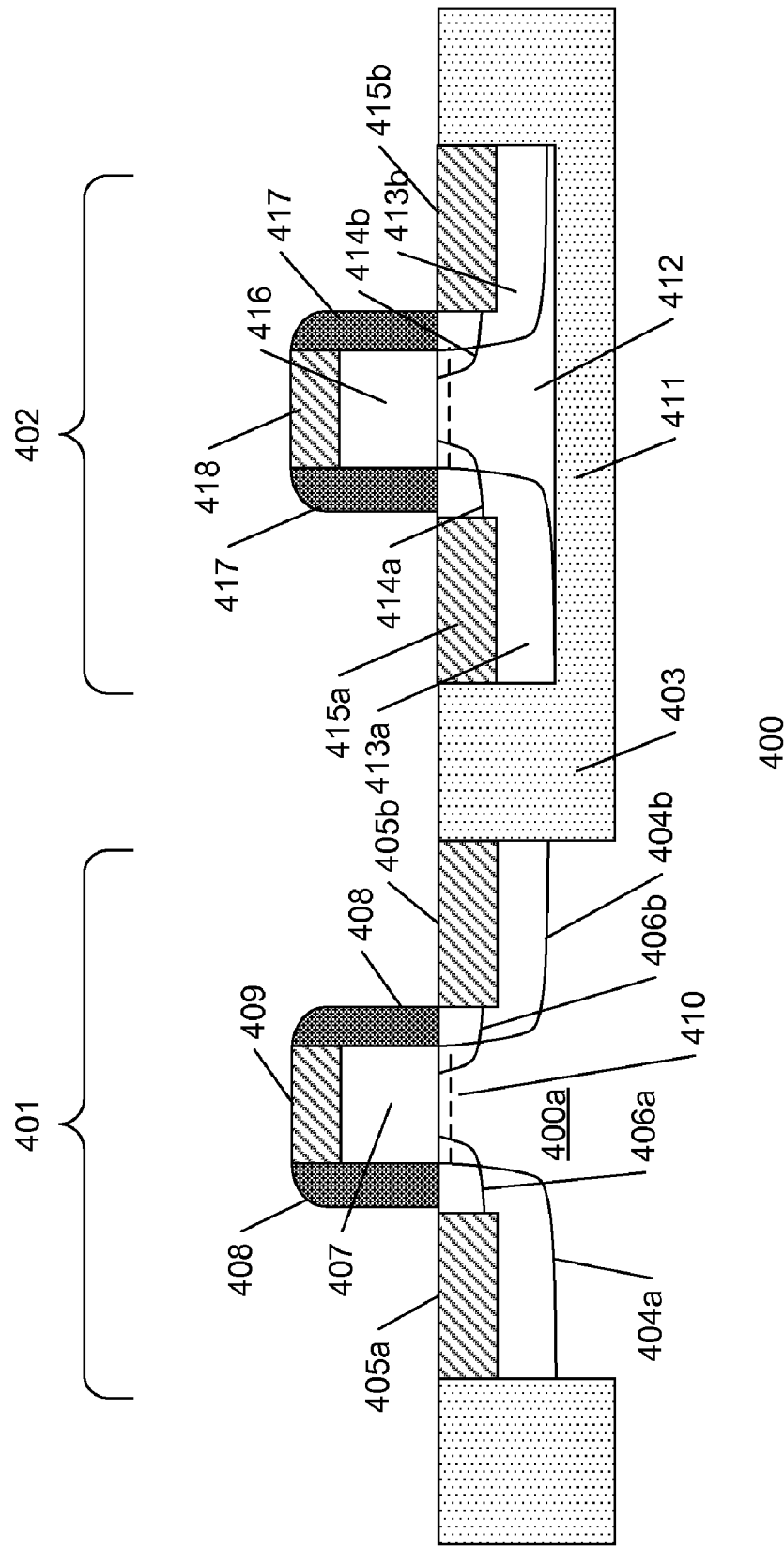
FIG. 4 shows a fourth illustrative embodiment of a hybrid substrate technology circuit including a silicon-based CMOS device and an indium phosphide radio frequency transistor.

FIG. 4 shows a fourth illustrative embodiment of a hybrid substrate technology circuit including a silicon-based CMOS device and an indium phosphide radio frequency transistor.

FIG. 4 shows a CMOS device 401 and an indium phosphide radio frequency (RF) device 402. The CMOS device 401 may be similar to those described above. For instance, an epitaxial growth layer of silicon 400a may be grown on substrate 400. CMOS device 401 may be formed in the epitaxial layer 400a based on conventional processing techniques. FIG. 4 also shows shallow trench isolation regions 403 separating the CMOS device 401 from other devices (including but not limited to other devices and indium phosphide devices). CMOS device 401 may be a conventional CMOS device including a source deep implantation region 404a and a drain deep implantation region 404b. Shallower implantation regions are shown in FIG. 4 as a source shallow implantation region 406a and drain shallow implantation region 406b. CMOS device 401 includes source contact region 405a and drain contact region 405b. CMOS device 401 includes gate 407 with gate contact 409 bounded by sidewalls 408. As is known in the art, a gate oxide exists between gate 407 (not shown) and epitaxial layer 400a. During operation channel 410 is formed under the gate oxide and permits operation of the device. The various processing techniques to form CMOS device 401 are known in the art and not addressed in detail here.

RF device 402 may be formed on the buried oxide layer 411. First, a gallium arsenide GaAs layer 412 is deposited or grown (for instance, by epitaxial growth as is known in the art) on the buried oxide layer 411. RF device 402 includes a source deep implantation region 413a and a drain deep implantation region 413b. Shallower implantation regions are shown in FIG. 4 as a source shallow implantation region 414a and drain shallow implantation region 414b. RF device 402 includes source contact region 415a and drain contact region 415b. RF device 402 includes gate 416 with gate contact 418 bounded by sidewalls 417. As is known in the art, a gate oxide exists between gate 416 (not shown) and gallium arsenide layer 412. During operation, channel 419 is formed under the gate oxide and permits operation of the device. The various processing techniques to form RF device 402 are known in the art and not addressed in detail here.

Indium phosphide InP radio frequency devices are useful in military and commercial applications where low noise figures and high gain, particularly at millimeter-wave frequencies, are required. Through the use of a hybrid substrate technology as shown in FIG. 4, indium phosphide RF devices may be placed alongside silicon-based CMOS devices on a common substrate. Accordingly, overall size, interconnect complexity (between chips), and interconnect noise and delay may be reduced by placing indium phosphide RF devices next to their CMOS control logic.

Fifth Embodiment

Figure 5:
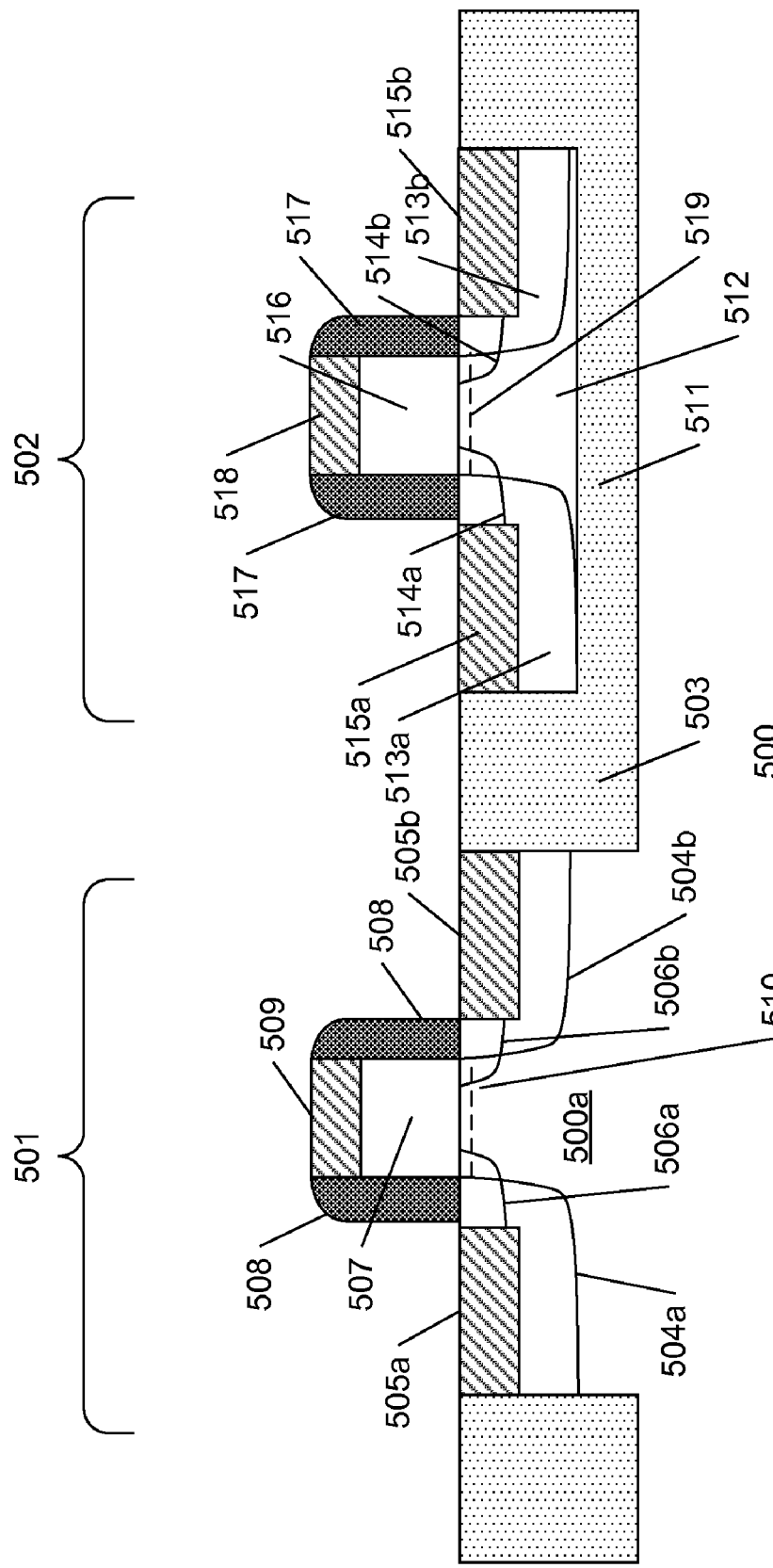
FIG. 5 shows a fifth illustrative embodiment of a hybrid substrate technology circuit including a silicon-based pFET device and a silicon germanium nFET device.

FIG. 5 shows a fifth illustrative embodiment of a hybrid substrate technology circuit including a silicon-based pFET device and a silicon germanium nFET device.

FIG. 5 shows nFETs and pFETs formed with silicon germanium SiGe and silicon substrates, respectively. FIG. 5 represents the pFETs by pFET 501 formed on epitaxial layer 500a that is formed on substrate 500. As described above, an epitaxial growth layer of silicon 500a may be grown on substrate 500. pFET device 501 may be formed in the epitaxial layer 500a based on conventional processing techniques. FIG. 5 also shows shallow trench isolation regions 503 separating the pFET device 501 from other devices (including but not limited to other pFET devices and nFET devices). pFET device 501 may be a conventional pFET device including a source deep implantation region 504a and a drain deep implantation region 504b. Shallower implantation regions are shown in FIG. 5 as a source shallow implantation region 506a and drain shallow implantation region 506b. pFET device 501 includes source contact region 505a and drain contact region 505b. pFET device 501 includes gate 507 with gate contact 509 bounded by sidewalls 508. As is known in the art a gate oxide exists between gate 507 (not shown) and epitaxial layer 500a. During operation channel 510 is formed under the gate oxide and permits operation of the device. The various processing techniques to form pFET device 501 are known in the art and not addressed in detail here.

nFET device 502 may be formed on the buried oxide layer 511. First, a silicon germanium SiGe layer 512 is deposited or grown (for instance, by epitaxial growth as is known in the art) on the buried oxide layer 511. nFET device 502 includes a source deep implantation region 513a and a drain deep implantation region 513b. Shallower implantation regions are shown in FIG. 5 as a source shallow implantation region 514a and drain shallow implantation region 514b. nFET device 501 includes source contact region 515a and drain contact region 515b. nFET device 501 includes gate 516 with gate contact 518 bounded by sidewalls 517. As is known in the art, a gate oxide exists between gate 516 (not shown) and silicon germanium SiGe 512. During operation, channel 519 is formed under the gate oxide and permits operation of the device. The various processing techniques to form nFET device 502 are known in the art and not addressed in detail here.

Through the use of a hybrid substrate technology as shown in FIG. 5, a gallium arsenide GaAs nFET may be placed alongside silicon-based pFET on a common substrate. As is known, although following the same design rule, silicon nFETs and silicon pFETs may operate differently based on differences in carrier mobility and other differences. This difference in operation between nFETs and pFETs when having the same semiconductor body can also apply to other semiconductor types. By matching carrier mobility and other aspects of semiconductor FETs based on body type, the differences between nFETs and pFETs can be minimized. Accordingly, the same design rule may be used for both the pFET 501 and the nFET 502 by selecting the different body types of the transistors such that the differences in mobility and other factors between the nFET and pFET are equalized.

Sixth Embodiment

Figure 6:
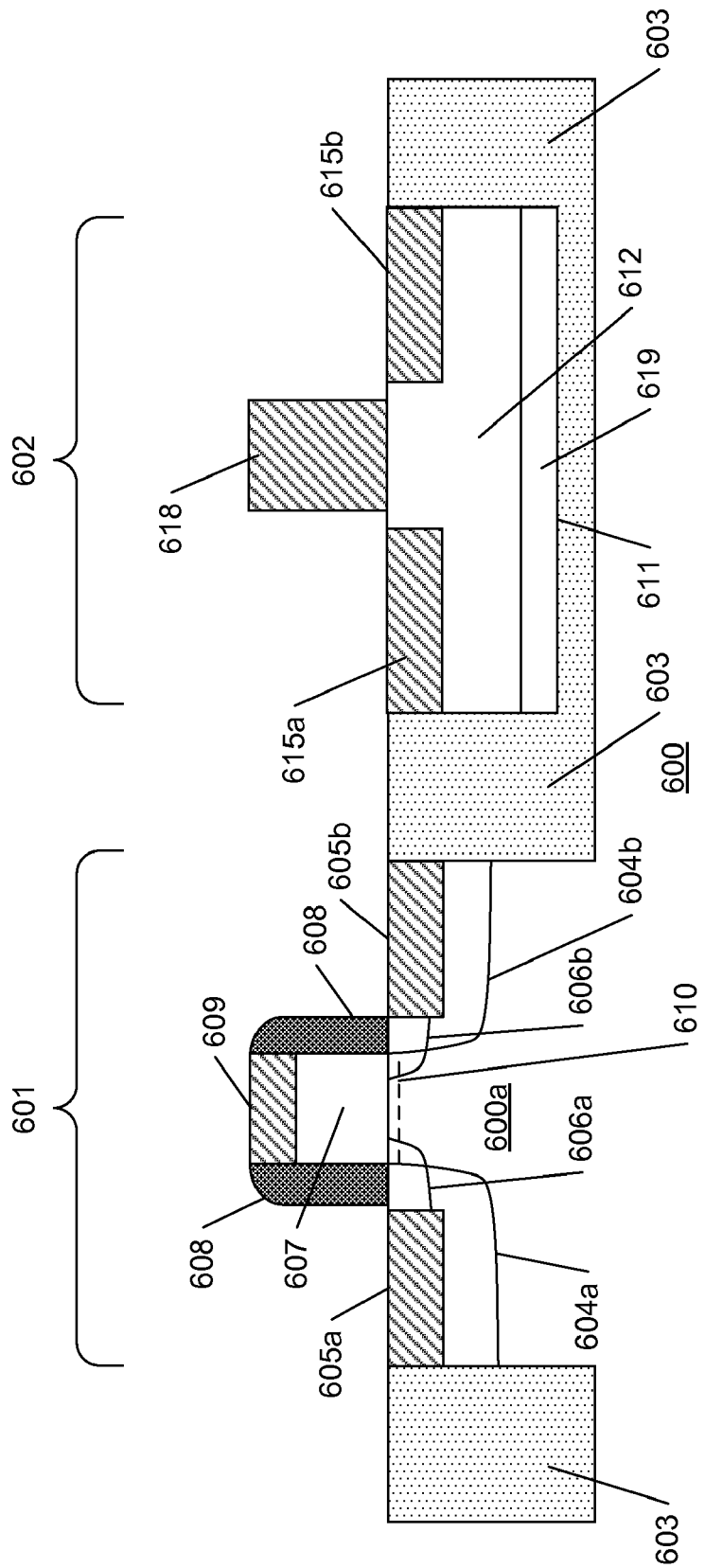
FIG. 6 shows a sixth illustrative embodiment of a hybrid substrate technology circuit including a silicon-based CMOS device and a gallium arsenide MESFET device.

FIG. 6 shows a sixth illustrative embodiment of a hybrid substrate technology circuit including a silicon-based CMOS device and a gallium arsenide MESFET device.

FIG. 6 shows a CMOS device 601 and gallium arsenide GaAs MESFET device 602. The CMOS device 601 may be similar to those described above. For instance, an epitaxial growth layer of silicon 600 and a may be grown on substrate 600. CMOS device 601 may be formed in the epitaxial layer 600a based on conventional processing techniques. FIG. 6 also shows shallow trench isolation regions 603 separating the CMOS device 601 from other devices (including but not limited to other devices and indium phosphide devices). CMOS device 601 may be a conventional CMOS device including a source deep implantation region 604a and a drain deep implantation region 604b. Shallower implantation regions are shown in FIG. 6 as a source shallow implantation region 606a and drain shallow implantation region 606b. CMOS device 601 includes source contact region 605a and drain contact region 605b. CMOS device 601 includes gate 607 with gate contact 609 bounded by sidewalls 608. As is known in the art, a gate oxide exists between gate 607 (not shown) and epitaxial layer 600a. During operation channel 610 is formed under the gate oxide and permits operation of the device. The various processing techniques to form CMOS device 601 are known in the art and not addressed in detail here.

MESFET device 602 may be formed on the buried oxide layer 611. First, a back conductor 620 is formed above buried oxide 611. Next, a gallium arsenide GaAs layer 612 is deposited or grown (for instance, by epitaxial growth as is known in the art) on the back conductor 620. MESFET device 602 is generally shown in FIG. 6 to include a source contact 615a, a drain contact 615b, and gate contact 618 forming a Schottky junction with body layer 612. The various processing techniques to form MESFET device 602 are known in the art and not addressed in detail here.

MESFET devices are faster than silicon-based MOSFET devices and are used for microwave frequency communications and radar. However, they are more expensive than silicon-based MOSFETs. Through the use of a hybrid substrate technology as shown in FIG. 6, GaAs MESFET devices may be placed alongside silicon-based CMOS devices on a common substrate. Accordingly, overall size, interconnect complexity (between chips), and interconnect noise and delay may be reduced by placing GaAs MESFET devices next to their CMOS control logic.

Hybrid Substrates

Figure 7:
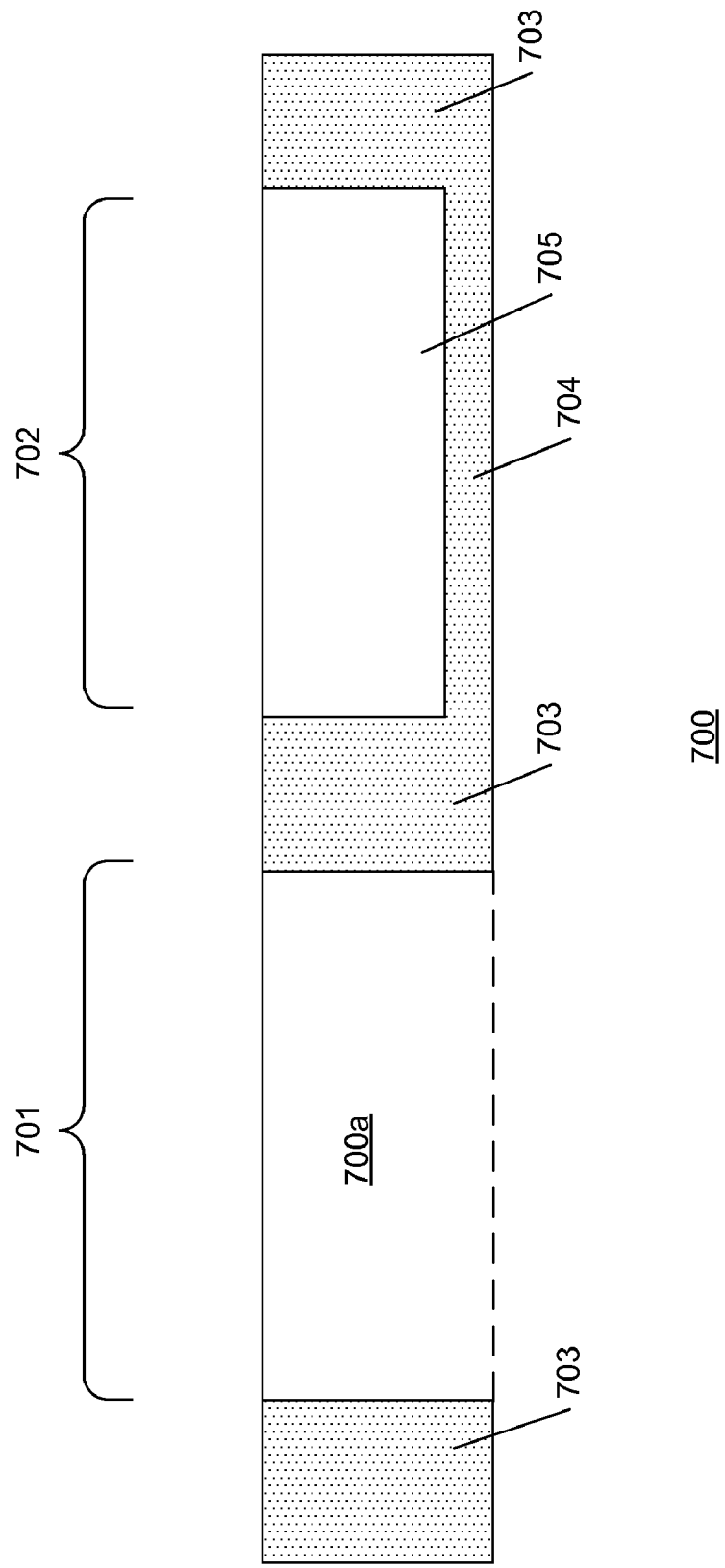
FIG. 7 shows a basic structure of a hybrid substrate device in accordance with one or more aspects of the invention.

FIG. 7 shows a basic structure of a hybrid substrate device in accordance with one or more aspects of the invention. FIG. 7 shows bulk semiconductor substrate 700 with epitaxial layer 700a grown on top of it. The previous embodiments describe bulk semiconductor 700 and epitaxial layer 700a. However, it is appreciated that in each of the above embodiments, epitaxial layer 700a may be eliminated and the device 701 (including devices 101, 201, 301, 401, 501, and 601) formed directly in substrate 700.

It is appreciated that other materials may be used in place of silicon, silicon germanium, indium phosphide, and gallium arsenide. These types of semiconductors are provided as examples.

Further, the above embodiments describe bulk semiconductor 700 as silicon and the epitaxial layer 700a as silicon while the alternative semiconductor material (SiGe, InP, GaAs, etc.) is formed on the buried oxide layer 704. It is appreciated that the positions of the types of semiconductors may be switched. For instance, for integrated circuits where the non-silicon devices require more real-estate than the silicon devices, it may be beneficial to use a non-silicon bulk semiconductor and use silicon as the semiconductor 705 above buried oxide layer 704.

Figure 8:
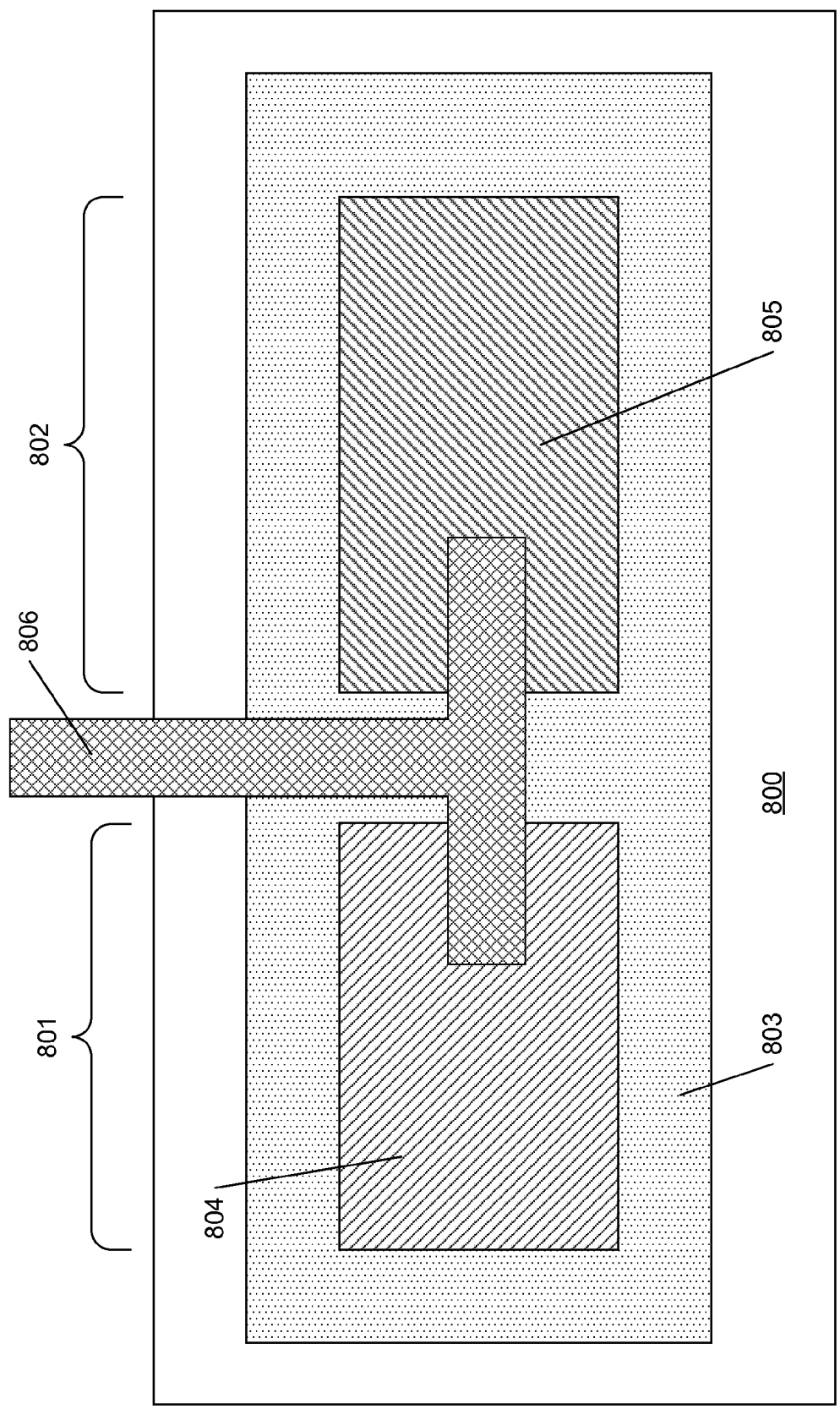
FIG. 8 shows a plan view of a portion of a hybrid substrate device in accordance with more or more aspects of the invention.

FIG. 8 shows a plan view of a portion of a hybrid substrate device in accordance with more or more aspects of the invention. FIG. 8 is only an example to show relationships between regions. Semiconductor substrate 800 is shown for purposes of explanation. It is appreciated that the substrate will likely be covered by additional layers as opposed to being shown exposed in explanatory FIG. 8. Two circuit regions are shown: 801 and 802. A buried oxide layer underlies, in this example, circuit 802. Shallow trench isolation STI is shown surrounding the circuits 801 and 802. It is appreciated that STI may or may not be used as is known in the art. For instance, STI may only be employed to isolate parts of a circuit while not being needed for the isolation of other parts. Region 804 is where circuit 801 is formed. Region 805 is where circuit 802 is formed. The material of region 804 may be an epitaxial layer grown on substrate 800 (or on an intervening layer or layers) or may be substrate 800 itself. The material of region 805 overlies the buried oxide layer and may be of a different semiconductor material than the material of substrate and/or the material in region 804. Interconnect(s) 806 represents that the circuit or circuits in region 804 can be connected with the circuit or circuits in region 805 and to other parts of an integrated circuit.

Alternative Embodiments

Alternative implementations of the hybrid substrate technology are available. For instance, in the first embodiment, instead of using InP as the semiconductor material, GaAs may be used and the structure of the HEMT adjusted accordingly as is known in the art (when manufacturing GaAs HEMTs in place of InP HEMTs). Similarly, pseudomorphic high electron mobility transistors (P-HEMTs) may be manufactured using the GaAs semiconductor material in place of the InP of the first embodiment.

Next, in reference to the second embodiment, GaAs may be used in place of InP as the semiconductor layer above the buried oxide layer in the manufacture of the HBTs and the structure of the HBT adjusted accordingly as is known in the art (when manufacturing GaAs HBTs in place of InP HBTs).

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. Numerous other embodiments, modifications, and variations within the scope and spirit of the appended claims will occur to persons of ordinary skill in the art from a review of this disclosure.

What is claimed is:

1. A hybrid substrate circuit comprising:
   a substrate;
   a first region of a first semiconductor material directly on the substrate;
   a second region including a buried oxide layer above the substrate and a second semiconductor material directly on the buried oxide layer;
   a first circuit formed in said first semiconductor material; and
   a second circuit formed in said second semiconductor material;
   wherein the first semiconductor material is silicon and the second semiconductor material is silicon germanium.

2. The hybrid substrate circuit according to claim 1, further comprising:
   shallow trench isolation regions between the first circuit and the second circuit.

3. The hybrid substrate circuit according to claim 1, wherein the first circuit is a pFET.

4. The hybrid substrate circuit according to claim 1, wherein the first circuit is a pFET and the second circuit is an nFET.

5. The hybrid substrate circuit according to claim 1, wherein the first circuit is a CMOS circuit.

6. The hybrid substrate circuit according to claim 5, wherein the second circuit is a high electron mobility transistor circuit.

7. The hybrid substrate circuit according to claim 5, wherein the second circuit is a pseudomorphic high electron mobility transistor circuit.

8. The hybrid substrate circuit according to claim 5, wherein the second circuit is a heterojunction bipolar transistor circuit.

9. The hybrid substrate circuit according to claim 5, wherein the second circuit is a radio frequency circuit.

10. The hybrid substrate circuit according to claim 5, wherein the second circuit is a MESFET circuit.

* * * * *